(12) United States Patent
Rahman

(10) Patent No.: US 7,966,533 B2
(45) Date of Patent: Jun. 21, 2011

(54) REGISTER DEVICE AND METHODS FOR USING SUCH

(75) Inventor: Mohammad Jahidur Rahman, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1217 days.

(21) Appl. No.: 11/614,060

(22) Filed: Dec. 20, 2006

(65) Prior Publication Data

US 2008/0150576 A1    Jun. 26, 2008

(51) Int. Cl.
*G01R 31/28*    (2006.01)
(52) U.S. Cl. ........................ 714/724; 714/726
(58) Field of Classification Search .................. 714/726, 714/724
See application file for complete search history.

(56) References Cited

U.S. PATENT DOCUMENTS

| 5,719,878 A * | 2/1998 | Yu et al. .................. 714/726 |
| 6,499,123 B1 * | 12/2002 | McFarland et al. ........... 714/724 |

* cited by examiner

*Primary Examiner* — Jeffrey A Gaffin
*Assistant Examiner* — Daniel F McMahon
(74) *Attorney, Agent, or Firm* — John J. Patti; Wade J. Brady, III; Frederick J. Telecky, Jr.

(57) ABSTRACT

Various systems and methods for registering data are disclosed herein. For example, test enabled flip-flop devices are provided. Such devices include a test mode input signal and a register output signal. In addition, the devices include a flip-flop with a data input and a clock input. When the test mode input signal is de-asserted, the flip-flop is operable to register the data input upon a transition of the clock input. Further, the registered data input signal is provided as the register output signal. The devices also include a test circuit with a test data input. The test circuit is operable to provide the test data input signal as the register output signal when the test mode input signal is asserted.

13 Claims, 5 Drawing Sheets

US 7,966,533 B2

REGISTER DEVICE AND METHODS FOR USING SUCH

BACKGROUND OF THE INVENTION

The present invention is related to logic circuitry, and more particularly to test enabled flip-flops.

As shown in FIG. 1, a semiconductor device 100 includes a number of I/O buffers 110, 120 that are available for bringing input signals 125 onto a chip 140, and for providing output signals 150 to off chip recipients. The input signals 125 are provided to a core logic block 130, and the output signals 115 are driven by core logic block 130. Over the years various testing schemes and/or approaches have been developed to verify semiconductor devices such as that shown in FIG. 1.

As shown in FIG. 2, prior testing methodologies have extended the functionality of core logic 130 to include a multiplexer 260 and a multiplexer 270. Multiplexers 260, 270 provide an ability to select a test mode via a test select input 271, and to select one of many test modes 250 using a mode select input 261. In particular, mode select input 271 drives a selector input of multiplexer 260 such that one of test inputs 251, 252, 253, 254, 255 are selected to drive a test output 262. Test mode input 271 drives a selector input of multiplexer 270 such that one of a standard operational output 263 or test output 262 is selected to drive output 115 via an output buffer 272. As will be appreciated, testing core logic 130 includes providing a signal from core logic 130 (one of signals 251, 252, 253) to output 115 via five input multiplexer 260, two input multiplexer 270, and output buffer 272. Assuming the test signal is being driven by core logic 130 and includes some delay there from, the propagation time of a test signal and that of a standard signal are represented by the following equation:

$$\text{Test}_{Delay} = \text{Core}_{Delay} + \text{Mux } 260_{Delay} + \text{Mux } 270_{Delay} + \text{Output Buffer}_{Delay},$$

$$\text{Standard}_{Delay} = \text{Core}_{Delay} + \text{Mux } 270_{Delay} + \text{Output Buffer}_{Delay}.$$

It should be noted that Mux $260_{Delay}$ increases as a function of the number of implemented test modes. The previously described delay may be too large for some upcoming devices that rely on very high clock frequencies to perform the designed functionality.

Hence, for at least the aforementioned reasons, there exists a need in the art for advanced systems and methods for facilitating semiconductor testing.

BRIEF SUMMARY OF THE INVENTION

The present invention is related to logic circuitry, and more particularly to test enabled flip-flops.

Various systems and methods for registering data are disclosed herein. For example, some embodiments of the present invention provide test enabled flip-flop devices. Such devices include a test mode input signal and a register output signal. In addition, the devices include a flip-flop with a data input and a clock input. When the test mode input signal is deasserted, the flip-flop is operable register the data input upon a transition of the clock input. The registered data input signal is provided as the register output signal. The devices also include a test circuit with a test data input. The test circuit is operable to provide the test data input signal as the register output signal when the test mode input signal is asserted.

In some cases of the aforementioned embodiments, the register output signal includes both a positive and a negative signal where the negative signal is an inverted version of the positive signal. In some cases, the clock input is gated by the test mode input signal. In one particular case, the gating is achieved by applying both the clock input and the test mode input signal to respective inputs of a NOR gate. Thus, when the test mode input signal is asserted high, the output of the NOR gate is asserted low regardless of the state of the clock input. Otherwise, when the test mode input signal is asserted low, the clock signal is reflected at the output of the NOR gate. Based on the disclosure provided herein, one of ordinary skill in the art will recognize a variety of ways to gate the clock input.

In various instances of the aforementioned embodiments, the flip-flop includes two gated inverter circuits. In one particular case, the first of the gated inverter circuits receives a data input and provides an inverted version of the data input whenever the clock input is asserted low; and the second of the gated inverter circuits receives the output of the first gated inverter circuit and provides an inverted version thereof whenever the clock input is asserted high. In some cases, the output of the first gated inverter circuit drives an inverter chain. The inverter chain may include two inverters arranged in a serial fashion. Thus, the inverter chain results in the same signal assertion level as the signal input thereto, and may be mimicked by a series of delay elements that result in the same delay as the series of inverters.

In some particular instances, the aforementioned first gated inverter circuit includes a chain of two P-type and two N-type transistors. The first P-type transistor is electrically coupled to an upper voltage, the second P-type transistor is electrically coupled to the first P-type transistor, the first N-type transistor is electrically coupled to the second P-type transistor, and the second N-type transistor is electrically coupled between the first N-type transistor and a lower voltage. An output of the first gated inverter is taken at the junction of the second P-type transistor and the first N-type transistor. The gate of the first P-type transistor and the gate of the second N-type transistor are electrically coupled to the data input. A delayed version of the clock input is electrically coupled to the gate of the second P-type transistor, and a delayed and inverted version of the clock input is electrically coupled to the gate of the first N-type transistor.

The second gated inverter circuit is composed of a second similarly connected group of transistors. In contrast, however, the gate of the first P-type transistor of the second transistor chain and the gate of the second N-type transistor of the second transistor chain are electrically coupled to the output of the first transistor chain. A delayed and inverted version of the clock input is electrically coupled to the gate of the second P-type transistor of the second transistor chain, and a delayed version of the clock input is electrically coupled to the gate of the first N-type transistor of the second transistor chain.

In various instances of the aforementioned embodiments, the test circuit also includes two gated inverter circuits. In one particular case, the first of the gated inverter circuits of the test circuit receives a test data input and provides an inverted version of the test data input whenever the test mode input signal is asserted high; and the second of the gated inverter circuits receives the output of the first gated inverter circuit and provides an inverted version thereof whenever the test mode input is asserted low.

In some particular instances, the aforementioned first gated inverter circuit of the test circuit includes a chain of two P-type and two N-type transistors. The first P-type transistor is electrically coupled to an upper voltage, the second P-type transistor is electrically coupled to the first P-type transistor, the first N-type transistor is electrically coupled to the second P-type transistor, and the second N-type transistor is electrically coupled between the first N-type transistor and a lower voltage. An output of the first gated inverter is taken at the junction of the second P-type transistor and the first N-type transistor. The gate of the first P-type transistor and the gate of the second N-type transistor are electrically coupled to the test data input. An inverted version of the test mode input is electrically coupled to the gate of the second P-type transistor, and the test mode input is electrically coupled to the gate of the first N-type transistor.

The second gated inverter circuit of the test circuit is composed of a second similarly connected group of transistors. In contrast, however, the gate of the first P-type transistor of the second transistor chain and the gate of the second N-type transistor of the second transistor chain are electrically coupled to the output of the first transistor chain. The test mode input is electrically coupled to the gate of the second P-type transistor of the second transistor chain, and the inverted test mode input is electrically coupled to the gate of the first N-type transistor of the second transistor chain.

Other embodiments of the present invention provide methods for testing a semiconductor device. The methods include providing a register device with a test mode input signal, a register output signal, a flip-flop, and a test circuit. The flip-flop includes a data input and a clock input. When the test mode input signal is de-asserted, the flip-flop is operable to register the data input upon a transition of the clock input. The registered data input signal is provided as the register output signal. The test circuit includes a test data input and receives the test mode input signal. The method further includes asserting the test mode input signal whereupon the test data signal is electrically coupled to the register output signal. In some instances, the methods further include de-asserting the test mode input signal whereupon the data input is reflected at the register output signal upon a transition of the clock signal. The transition of the clock cycle may be either a positive going edge of the clock signal or a negative going edge of the clock signal. Some instances of the methods further include gating the clock with the test mode input signal.

Yet other embodiments of the present invention provide test enabled flip-flop devices. Such flip-flops devices include a test mode input signal, a flip-flop and a test circuit. The flip-flop has a data input, a clock input, a register output signal, and a clock gate. The clock gate receives the test mode input signal and the clock input, and is operable to gate the clock input whenever the test mode input signal is asserted. When the test mode input signal is de-asserted, the flip-flop is operable to register the data input upon a transition of the clock input, and to provide the registered data input signal as the register output signal. The test circuit includes a test data input, and is operable to provide the test data input signal as the register output signal when the test mode input signal is asserted.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to logic circuitry, and more particularly to test enabled flip-flops.

Various embodiments of the present invention provide a solution to the previously described delay that is introduced to semiconductor devices due to a need to support test modes. In some case, some or all of the logic associated with testing is contained between the flip-flops of a synchronous digital design. As such, the delay time of the interface to the semiconductor device is given by the following equation:

Interface time=flop delay+net delay+*IO* delay

Thus, there is not logic delay contribution between the interface flip-flop and the I/O of the semiconductor device. The same structure may be applied to both the input and output interfaces of the semiconductor device. Thus, while the following description focuses on the output structure, based on the disclosure provided herein, one of ordinary skill in the art will appreciate that the principles discussed are easily applied to the input structures as well. Using one or more embodiments of the present invention, for example, Boundary Scan or other test approaches may be implemented with only minimal concern to the effect on input and output timing. It should be noted that as used herein, the phrase "electrically coupled" is used in its broadest sense to mean any coupling whereby an electrical signal may be passed from one circuit element to another. Thus, for example, two circuit devices may be electrically coupled using a wire connecting the devices. Alternatively, two devices may be electrically coupled less directly via an intervening electrical device.

Figure 1:
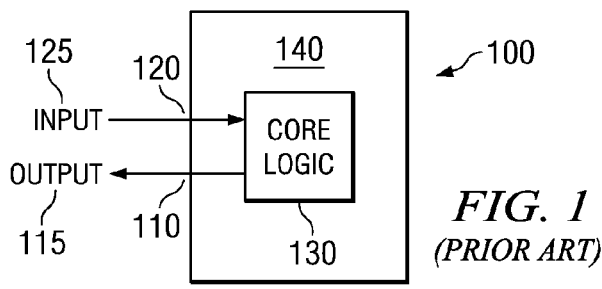
FIG. 1 is a block diagram of an existing semiconductor device.
Figure 2:
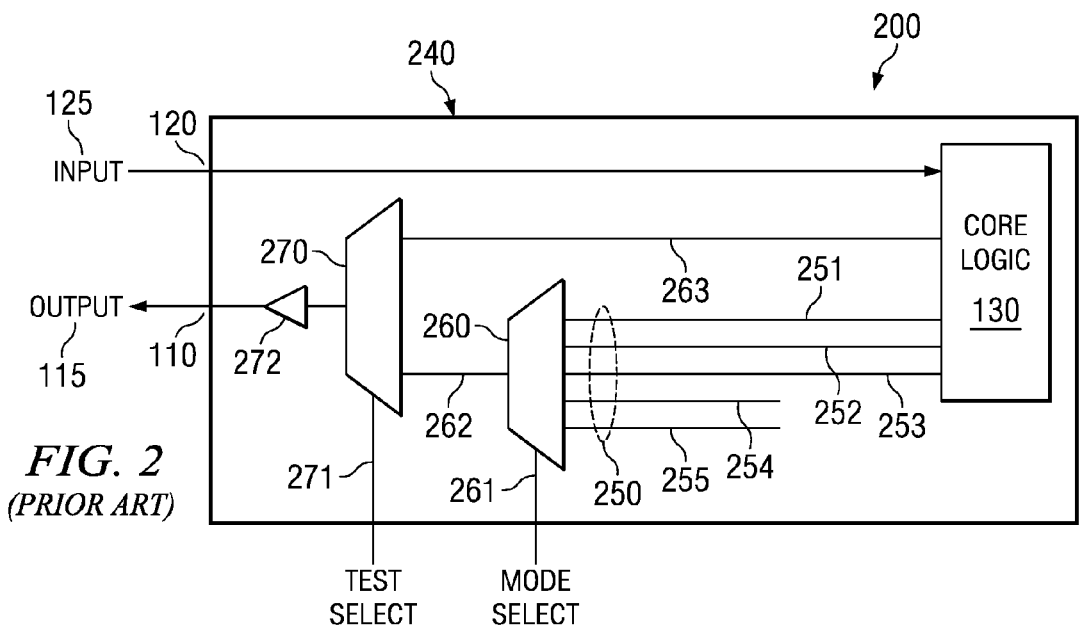
FIG. 2 is a block diagram of the semiconductor device of FIG. 1 using a pre-existing approach for testing.
Figure 3:
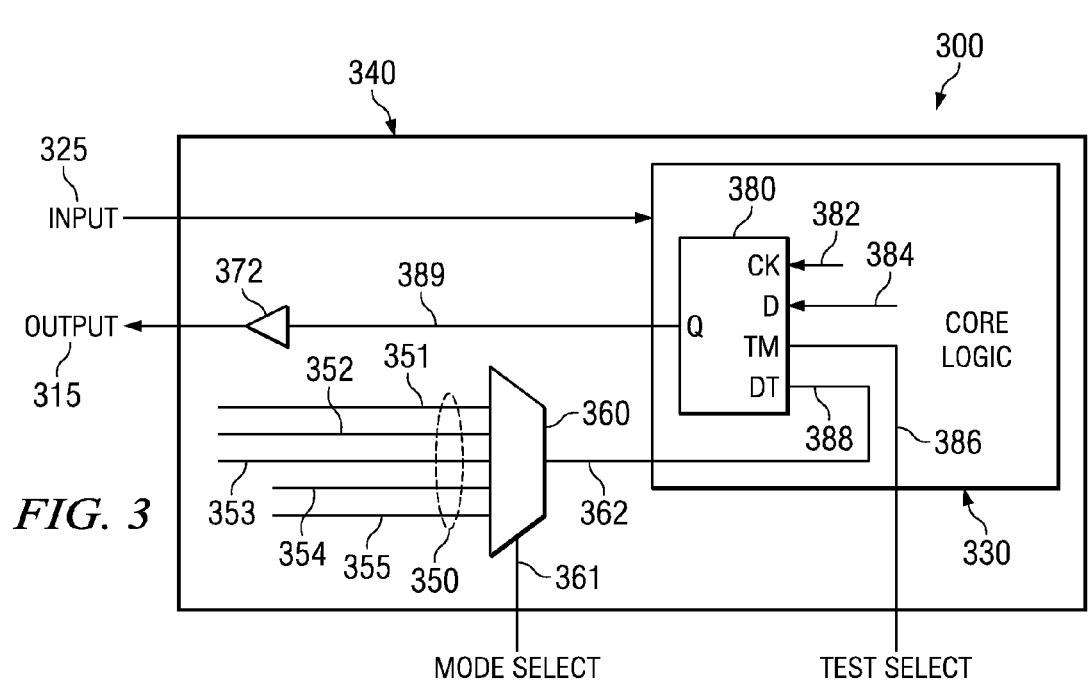
FIG. 3 is a block diagram of a semiconductor device with test functionality implemented in accordance with some embodiments of the present invention.

Turning to FIG. 3, a block diagram of a semiconductor device 300 with test functionality implemented in accordance with some embodiments of the present invention is depicted. Semiconductor device 300 includes core logic 330 that is extended to include a multiplexer 360, and that includes one or more test modified flip-flops 380. Multiplexer 360 is a capable of receiving and selecting between many test modes 350. As shown, multiplexer 360 is operable to select between a test mode 351, a test mode 352, a test mode 253, a test mode 354 and a test mode 355. In some cases, one or more of the aforementioned test modes may be driven by signals from core logic 330. Some examples of the test modes that may be supported by one or more of test mode 351, test mode 352, test mode 253, test mode 354 and test mode 355 include, but are not limited to, NandTree, VOH/VOL, SCAN, JTAG, Boundary Scan, a custom built in self test, or the like. Based on the disclosure provided herein, one of ordinary skill in the art will appreciate other test modes that may be supported using systems and methods in accordance with one or more embodiments of the present invention. It should be noted that multiplexer 360 in some cases may be pipelined behind one or more stages of core logic 130 to avoid any setup timing issues that may be seen in a single stage set up.

Test modified flip-flop 380 includes a standard clock input 382, a standard data input 384 and a standard register output 389. In addition, test modified flip-flop 380 includes a test select input 386 and a data test input 388. Test mode input 386 is driven by a test select signal. Such a test select signal may come from off of chip 340, or may be selected via a programmable register on chip 340. Based on the disclosure provided herein, one of ordinary skill in the art will recognize a variety of approaches for signaling a test selection in accordance with the various embodiments of the present invention. Test data input 388 is electrically coupled to an output 362 of multiplexer 360. Thus, by properly asserting a mode select 361 of multiplexer 360, one of the many test modes 350 can be selected for application to the data test input of test enabled flip-flop 380.

Standard register output 389 drives an output buffer 372 that in turn drives an output 315. In some cases, test enabled flip-flop 380 includes an inverted register output (not shown) that is an inverted version of standard register output 389. When test enabled flip-flop 380 is operated in a normal mode, the test select input to test mode input 386 is de-asserted. As such, data applied to data input 384 is clocked into test enabled flip-flop on an edge of clock input 382. As will be appreciated by one of ordinary skill in the art based on the disclosure provided herein, test enabled flip flop may be designed such that either a positive transition or a negative transition of clock input 382 may cause the data presented at data input 382 to be registered by test enabled input 380. Upon registering the data at data input 382, register output 389 is asserted at the level of the input data. This level is maintained until the next clock transition. Thus, when the test select input is not asserted, test enabled flip-flop operates as a standard flip-flop that is known in the art.

In contrast, when the test select input applied to test mode input 286 is asserted, test output 362 provided to data test input 388 is connected to register output 389. This connection is achieved regardless of the state of clock input 382 or data input 384. Further, the connection from data test input 384 can be designed to require very little propagation delay. By providing this test mechanism within one or more flip-flops implemented as part of core logic 330, propagation delay of test signals and standard operation signals may be reduced when compared with other configurations. The following equations describe the aforementioned delay:

$$\text{Test}_{Delay} = \text{Mux } 360_{Delay} + \text{Core}_{Delay} + \text{Output Buffer}_{Delay},$$

$$\text{Standard}_{Delay} = \text{Core}_{Delay} + \text{Output Buffer}_{Delay}.$$

Based on the preceding equations, it can be seen that various embodiments of the present invention using test enabled flip-flops may be used to implement test functionality within a semiconductor device without overly limiting the frequency at which non-test functionality implemented in the semiconductor device is operated. Such test functionality may be desirable for performing manufacturing tests on a semiconductor device and is not applicable after the semiconductor device has been confirmed to be operational. In such cases, the various embodiments of the present invention provide an advantage in that the operational rate of the semiconductor device can be established with less regard to the test functionality that will ultimately be implemented in relation to the semiconductor device.

Figure 4A:
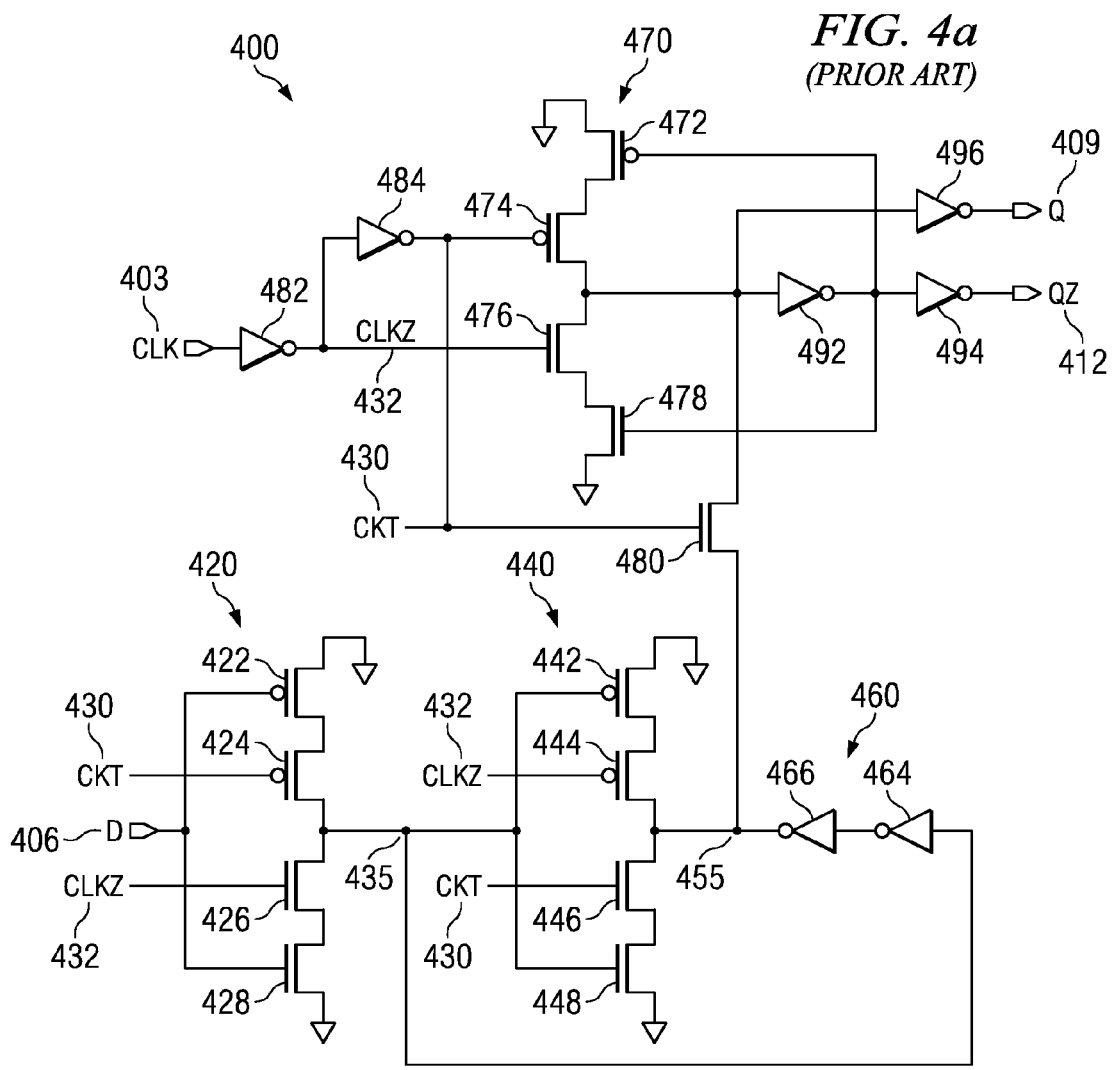
FIGS. 4a-4b depict a schematic and operational diagram of a prior art flip-flop.
Figure 4B:
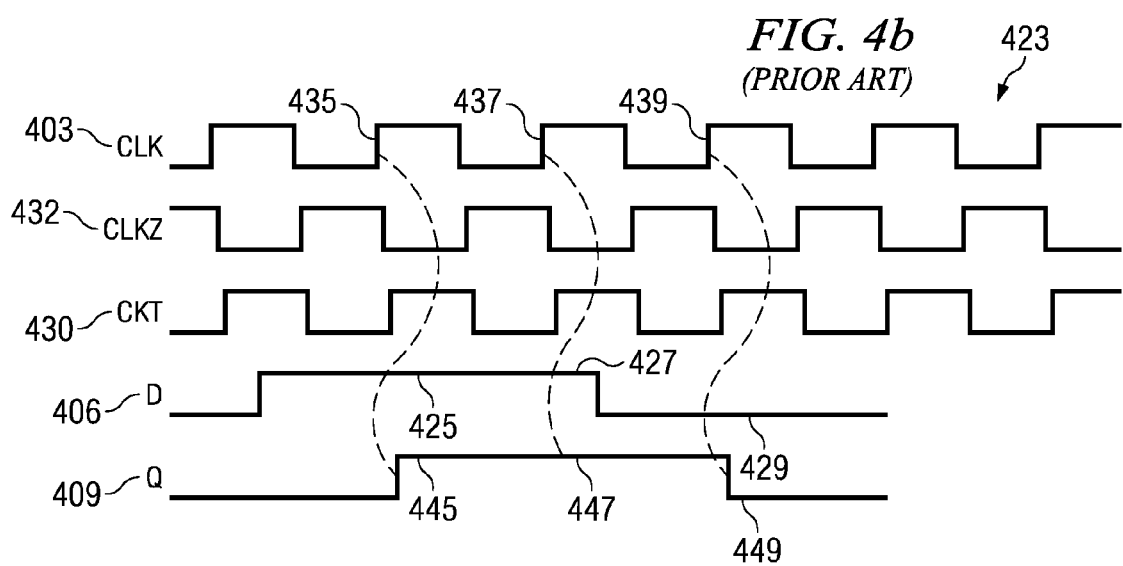

An exemplary prior art flip-flop is discussed in relation to FIG. 4a and FIG. 4b. This discussion of an exemplary prior art flip-flop aids the reader in understanding the changes that may be made to an exemplary flip-flop as are discussed in relation to FIG. 5a and FIG. 5b below. Turning now to FIG. 4a, a schematic of an exemplary prior art flip-flop 400 is presented. Flip-flop 400 includes a clock input 403, a data input 406, and a register output 409. In addition, an inverted version of register output 409 is provided as register output 412. In some cases, both register output 409 and register output 412 may be referred to separately or collectively as a "register output". It should be noted that as shown, flip-flop 400 has not been optimized for timing. Based on the disclosure provided herein, one of ordinary skill in the art will understand how to perform such an optimization and the changes that are required depending upon the technology in which flip-flop 400 is being implemented.

Flip-flop 400 includes a gated inverter circuit 420 and a gated inverter circuit 440. Gated inverter circuit 420 is implemented as a chain of transistors. The chain of transistors includes a P-type transistor 422 with its source electrically couple to an upper voltage source and its drain electrically coupled to the source of another P-type transistor 424. The drain of P-type transistor 424 is electrically coupled to the drain of an N-type transistor 426 and to an output node 435. The source of N-type transistor 426 is electrically coupled to the drain of another N-type transistor 428, and the source of N-type transistor 428 is electrically coupled to a lower voltage source. The gate of P-type transistor 424 is electrically coupled to a delayed version of clock input 403 (i.e., CLKT 430). The gate of N-type transistor 426 is electrically coupled to an inverted version of clock input 403 (i.e., CLKZ 432). Data input 406 is electrically coupled to the input of gated inverter circuit 420 by electrically coupling it to the gate of P-type transistor 422 and the gate of N-type transistor 428.

Gated inverter circuit 440 is also implemented as a chain of transistors (however, it should be noted that gated inverted circuit 440 may be implemented as a pass device, such as pass device 640 of FIG. 6 below). The chain of transistors includes a P-type transistor 442 with its source electrically coupled to the upper voltage source and its drain electrically coupled to the source of another P-type transistor 444. The drain of P-type transistor 444 is electrically coupled to the drain of an N-type transistor 446 and to an output node 455. The source of N-type transistor 446 is electrically coupled to the drain of another N-type transistor 448, and the source of N-type transistor 448 is electrically coupled to the lower voltage source. The gate of N-type transistor 446 is electrically coupled to a delayed version of clock input 403 (i.e., CLKT 430). The gate of P-type transistor 444 is electrically coupled to CLKZ 432. Output node 435 is electrically coupled to the input of gated inverter circuit 440 by electrically coupling it to the gate of P-type transistor 442 and to the gate of N-type transistor 448. In addition, output node 435 is electrically coupled to an inverter series 460 that includes an inverter 464 and an inverter 466 connected in series. The output of inverter series 460 is tied to output node 455. The source of a transistor 480 is electrically coupled to output node 455, and the drain of transistor 480 is electrically coupled to register output 409 via an inverter 496, and to register output 412 via a series of inverters 492, 494. The gate of transistor 480 is driven by CKT 430.

Clock input 403 is applied to an inverter 482, and the output of inverter 482 is CLKZ 432. CLKZ 432 is applied to another inverter 484, and the output of inverter 484 is CKT 430. A transistor chain 470 is driven by a combination of clock input 403 and output node 455. In particular, transistor chain 470 includes a first P-type transistor 472. The source of P-type transistor 472 is electrically coupled to the upper voltage, and the drain of P-type transistor 472 is electrically coupled to the source of a second P-type transistor 474. The gate of P-type transistor 472 is electrically coupled to output node 455 via transistor 480 and inverter 492. The drain of P-type transistor 474 is electrically coupled to a first N-type transistor 476, and the gate of P-type transistor 474 is electrically coupled to clock input 403 via inverter 482 and inverter 484 (i.e., CKT 430). The source of N-type transistor 476 is electrically coupled to the drain of N-type transistor 478, and the source of N-type transistor 478 is electrically coupled to a lover voltage. The gate of N-type transistor 476 is electrically coupled to clock input 403 via inverter 482 (i.e. CLKZ 432). The gate of N-type transistor 478 is electrically coupled to output node 455 via transistor 480 and inverter 492.

Turning to FIG. 4b, a diagram 423 depicts operation of flip-flop 400. As shown, when data input 406 is asserted high 425, register output 409 is asserted high 445 upon a positive transition 435 of clock input 403. Register output 409 is maintained high 427 upon the next positive transition 437 of clock input 403 when data input 406 remains asserted high 427. When data input 406 is asserted low 429, register output 409 is asserted low 449 upon a positive transition 439 of clock input 403. Again, FIG. 4b describes the typical operation of a prior art flip-flop.

Figure 5A:
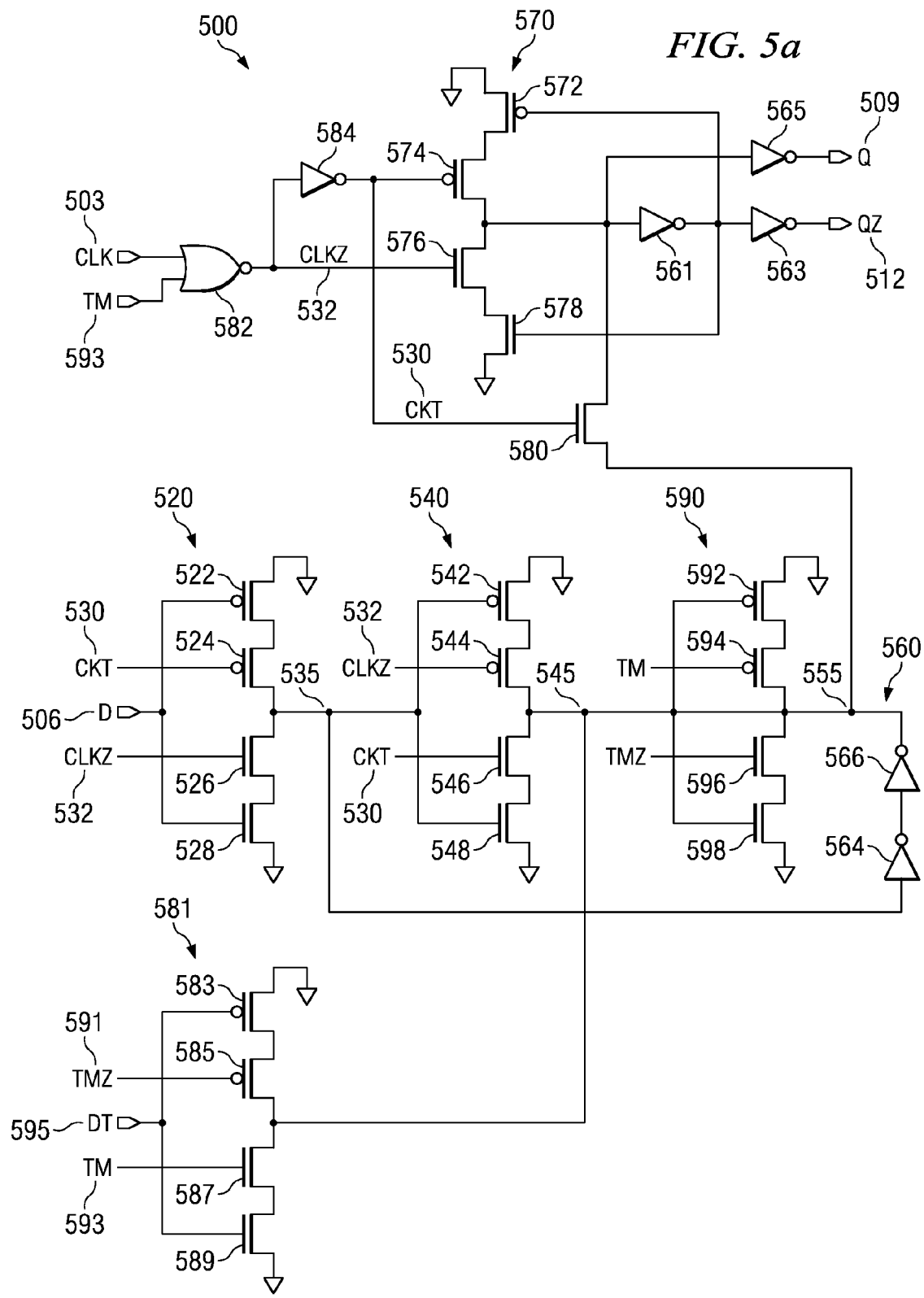
FIGS. 5a-5b depict a schematic and operational diagram of a test enabled flip-flop device in accordance with one or more embodiments of the present invention.

Turning to FIG. 5a, a test enabled flip-flop 500 in accordance with one or more embodiments of the present invention is depicted. As previously discussed, the implementation of test enabled flip-flop may in some cases be used to satisfy the requirements of test enabled flip-flop 380, or test enabled flip-flop 380 may be implemented another way. Flip-flop 500 includes a flip-flop circuit that is implemented substantially as the circuit in FIG. 4, and a test circuit that is integrated into the circuit of FIG. 4. The flip-flop circuit of flip-flop 500 includes a clock input 503, a data input 506, and a register output 509. In addition, an inverted version of register output 509 is provided as register output 512. In some cases, both register output 509 and register output 512 may be referred to separately or collectively as a "register output". The test circuit of flip-flop 500 includes a test select input 593, a test data input 595, and register output 509. Also, test select input 593 is inverted to create a TMZ signal 591.

The flip-flop circuit of flip-flop 500 includes a gated inverter circuit 520 and a gated inverter circuit 540. Gated inverter circuit 520 is implemented as a chain of transistors. The chain of transistors includes a P-type transistor 522 with its source electrically coupled to the upper voltage source and its drain electrically coupled to the source of another P-type transistor 524. The drain of P-type transistor 524 is electrically coupled to the drain of an N-type transistor 526 and to an output node 535. The source of N-type transistor 526 is electrically coupled to the drain of another N-type transistor 528, and the source of N-type transistor 528 is electrically coupled to the lower voltage source. The gate of P-type transistor 524 is electrically coupled to a delayed version of clock input 503 (i.e., CLKT 530). The gate of N-type transistor 526 is electrically coupled to CLKZ 532. Data input 506 is electrically coupled to the input of gated inverter circuit 520 by electrically coupling it to the gate of P-type transistor 522 and the gate of N-type transistor 528.

Gated inverter circuit 540 is also implemented as a chain of transistors. The chain of transistors includes a P-type transistor 542 with its source electrically coupled to the upper voltage source and its drain electrically coupled to the source of another P-type transistor 544. The drain of P-type transistor 544 is electrically coupled to the drain of an N-type transistor 546 and to an output node 545. The source of N-type transistor 546 is electrically coupled to the drain of another N-type transistor 548, and the source of N-type transistor 548 is electrically coupled to the lower voltage source. The gate of N-type transistor 546 is electrically coupled to a delayed version of clock input 503 (i.e., CLKT 530). The gate of P-type transistor 544 is electrically coupled to CLKZ 532. Output node 535 is electrically coupled to the input of gated inverter circuit 540 by electrically coupling it to the gate of P-type transistor 542 and N-type transistor 548. In addition, output node 535 is electrically coupled to an inverter series 560 that includes an inverter 564 and an inverter 566 connected in series. The output of inverter series 560 is tied to an output node 555. The source of a transistor 580 is electrically coupled to output node 555, and the drain of transistor 580 is electrically coupled to register output 509 via an inverter 565, and to register output 512 via a series of inverters 561, 563. The gate of transistor 580 is driven by CKT 530.

Clock input 503 is applied to a clock gate 582, and the output of clock gate 582 is CLKZ 532. As shown, clock gate 582 is a two input NOR gate. As such, whenever test select input 593 is asserted high, CLKZ 52 is asserted low regardless of the activity on clock input 503. Hence clock input 503 is gated whenever test select input 593 is asserted high. Based on the disclosure provided herein, one of ordinary skill in the art will recognize a variety of ways to gate clock 503 that may be used in relation to one or more embodiments of the present invention. CLKZ 532 is applied to inverter 584, and the output of inverter 584 is CKT 530. A transistor chain 570 is driven by a combination of clock input 503 and output node 555. In particular, transistor chain 570 includes a first P-type transistor 572. The source of P-type transistor 572 is electrically coupled to the upper voltage, and the drain of P-type transistor 572 is electrically coupled to the source of a second P-type transistor 574. The gate of P-type transistor 572 is electrically coupled to output node 555 via transistor 580 and inverter 561. The drain of P-type transistor 574 is electrically coupled to a first N-type transistor 576, and the gate of P-type transistor 574 is electrically coupled to clock input 503 via clock gate 582 and inverter 584 (i.e., CKT 530). The source of N-type transistor 576 is electrically coupled to the drain of N-type transistor 578, and the source of N-type transistor 578 is electrically coupled to the lower voltage. The gate of N-type transistor 576 is electrically coupled to clock input 503 via clock gate 582 (i.e. CLKZ 432). The gate of N-type transistor 578 is electrically coupled to output node 555 via transistor 580 and inverter 561.

The test circuit of flip-flop 500 includes a gated inverter circuit 581 and a gated inverter circuit 590. Gated inverter circuit 581 is implemented as a chain of transistors. The chain of transistors includes a P-type transistor 583 with its source electrically coupled to the upper voltage source and its drain electrically coupled to the source of another P-type transistor 585. The drain of P-type transistor 585 is electrically coupled to the drain of an N-type transistor 587 and to output node 545. The source of N-type transistor 587 is electrically coupled to the drain of another N-type transistor 589, and the source of N-type transistor 589 is electrically coupled to the lower voltage source. The gate of P-type transistor 585 is electrically coupled to an inverted version of test select input 593 (i.e., TMZ 591). The gate of N-type transistor 587 is electrically coupled to test select input 593. Test data input 595 is electrically coupled to the input of gated inverter circuit 581 by electrically coupling it to the gate of P-type transistor 583 and the gate of N-type transistor 589.

Gated inverter circuit 590 is also implemented as a chain of transistors. The chain of transistors includes a P-type transistor 592 with its source electrically coupled to the upper voltage source and its drain electrically coupled to the source of another P-type transistor 594. The drain of P-type transistor 594 is electrically coupled to the drain of an N-type transistor 596 and to output node 555. The source of N-type transistor 596 is electrically coupled to the drain of another N-type transistor 598, and the source of N-type transistor 598 is electrically coupled to the lower voltage source. The gate of N-type transistor 596 is electrically coupled to the inverted version of test select signal 593 (i.e., TMZ 591). The gate of P-type transistor 594 is electrically coupled to test select signal 593. Output node 545 is electrically coupled to the input of gated inverter circuit 590 by electrically coupling it to the gate of P-type transistor 592 and N-type transistor 598. In addition, output node 545 is electrically coupled to the drain of P-type transistor 585 and to the drain of N-type transistor 587.

Figure 5B:
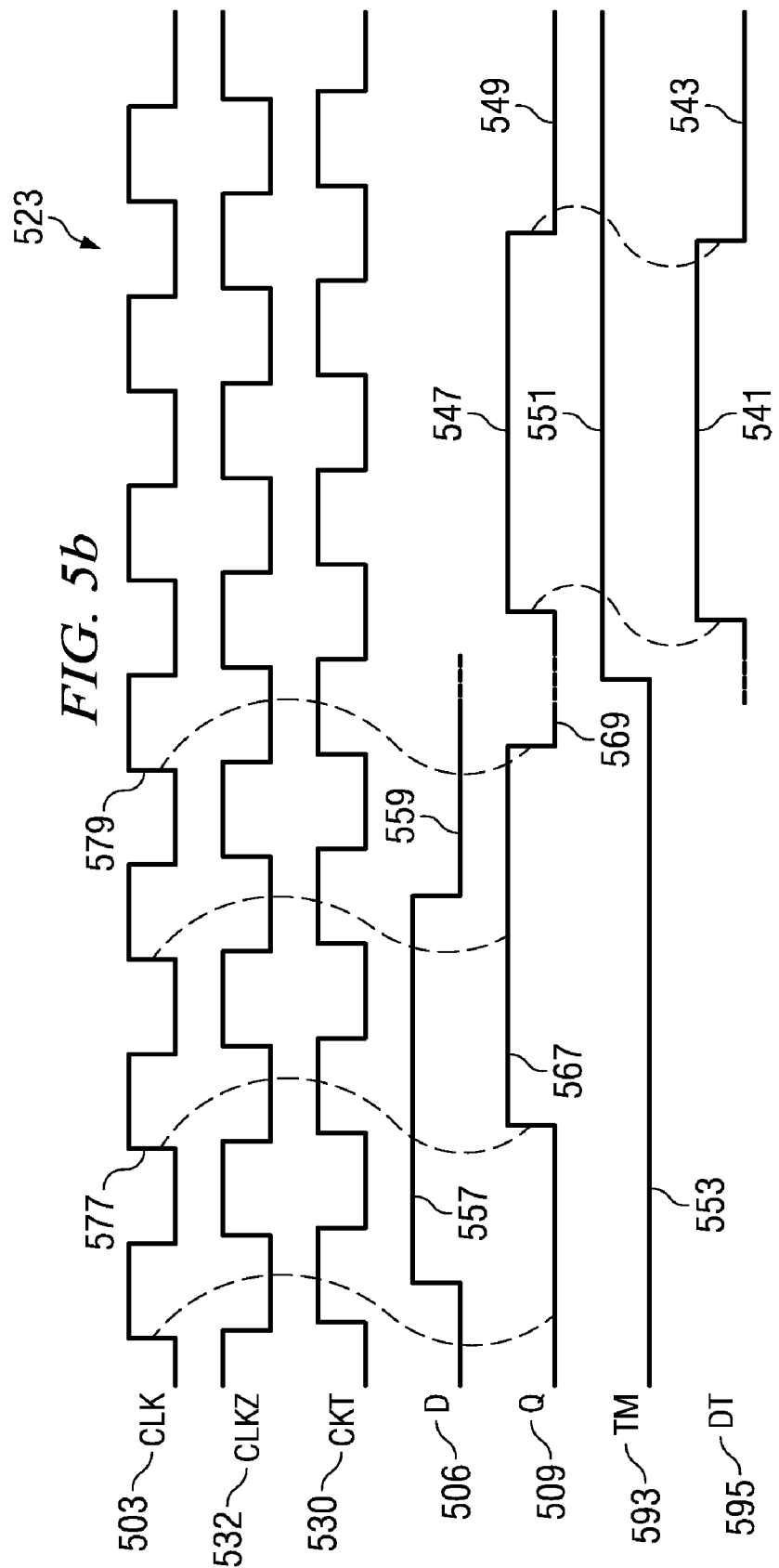

Turning to FIG. 5b, a diagram 523 depicts operation of test enabled flip-flop 500. As shown, when test select input 593 is asserted low 553, test enabled flip-flop 500 operates as a standard flip-flop. In particular, when data input 506 is asserted high 557, register output 509 is asserted high 567 upon a positive transition 577 of clock input 503. Register output 509 is maintained high upon the next positive transition 479 of clock input 503 when data input 506 remains asserted high. When data input 506 is asserted low 559, register output 509 is asserted low 569 upon a positive transition 579 of clock input 503.

In contrast, when test select input 593 is asserted high 551, test enabled flip-flop 500 operates to direct connect (plus some delay) test data input 595 to register output 509. Hence, when test data input 595 is asserted high 541, register output 509 is asserted high 547 regardless of the status of clock input 503. Similarly, when test data input 595 is asserted low 543, register output 509 is asserted low 549 regardless of the status of clock input 503.

Figure 6:
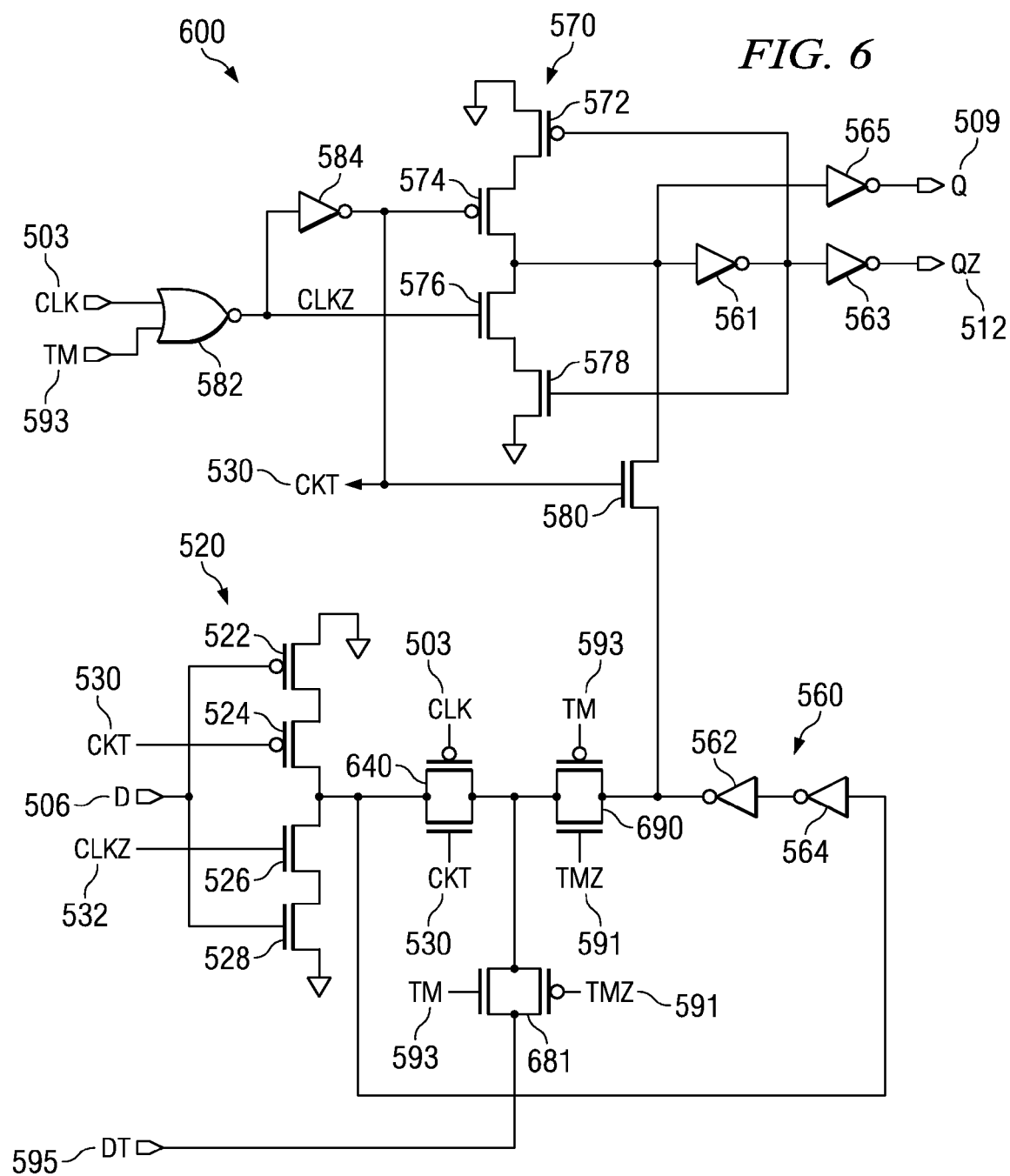
FIG. 6 shows another test-enabled flip-flop in accordance with other embodiments of the present invention.

Turning to FIG. 6, a test enabled flip-flop 600 is shown in accordance with other embodiments of the present invention. Test enabled flip-flop 600 operates in substantially the same way as test enabled flip-flop 500, except that gated inverter circuit 540 is replaced with a pass device 640, gated inverter circuit 590 is replaced with another pass device 690, and gated inverter circuit 581 is replaced with yet another pass device 681. Pass device 581 and pass device 590 are controlled by test select input 593 (and its inverted counterpart TMZ 591), and pass device 540 is controlled by CKT 530 and CLKZ 532 as shown. As will be appreciated based on the disclosure provided herein, when test select input 593 is asserted high, data test input 595 is direct coupled to output 509 via transistor 580 and inverter 565. Otherwise, test-enabled flip-flop operates as a standard flip-flop device.

In conclusion, the present invention provides novel systems, devices, methods for registering data. While detailed descriptions of one or more embodiments of the invention have been given above, various alternatives, modifications, and equivalents will be apparent to those skilled in the art without varying from the spirit of the invention. Further, while one purpose for register devices discussed in the application is to avoid the test delay introduced in a functional path, based on the disclosure provided herein, one of ordinary skill in the art will recognize a variety of other uses for such register devices. For example, one or more flip-flops in accordance with embodiments of the present invention may be used compromise between critical functional timing paths and less critical functional timing paths. Therefore, the above description should not be taken as limiting the scope of the invention, which is defined by the appended claims.

What is claimed is:

1. An apparatus comprising:
   a multiplexer; and
   logic that is operable to receive an input signal and a test mode input signal and that includes a test enabled flip-flop, wherein the test enabled flip-flop includes:
   a data input terminal;
   a clock input terminal that is operable to receive a clock signal;
   a test mode input terminal that is operable to receive the test mode input signal, wherein, when the test mode input signal is de-asserted, the test enabled flip-flop is operable to register and output data from the data input terminal upon a transition of the clock signal; and
   a test circuit that is operable to output test data when the test mode input signal is asserted, wherein the test circuit includes:
   an inverter chain;
   a first gated inverter circuit that is gated with the clock signal;
   a second gated inverter circuit that is gated with an inverse of the clock signal, wherein an output of the first gated inverter is applied to the second gated inverter circuit and to an input of the inverter chain;
   a third gated inverter circuit that is gated with test mode signal; and
   a fourth gated inverter circuit that is electrically coupled to the multiplexer and that is gated with the an inverse of the test mode signal, and wherein an output of the third gated inverter is electrically coupled to the output of the second gated inverter circuit and to the input of the fourth gated inverter circuit, and wherein the output of the fourth gated inverter is applied to an output of the inverter chain.

2. The apparatus of claim 1, wherein the test enabled flip-flop provides a register output signal and an inverted register output signal.

3. The apparatus of claim 1, wherein the clock signal is gated by the test mode input signal.

4. The apparatus of claim 3, wherein the clock signal is gated by the test mode input signal by a NOR gate.

5. The apparatus of claim 1, wherein the first gated inverter circuit further comprises a transistor chain that includes:
   a first P-type transistor that is electrically coupled to an upper voltage;
   a second P-type transistor that is electrically coupled to the first P-type transistor;
   a first N-type transistor that is electrically coupled to the second P-type transistor; and
   a second N-type transistor that is electrically coupled between the first N-type transistor and a lower voltage and wherein the output of the first gated inverter is taken at the junction of the second P-type transistor and the first N-type transistor, and wherein the gate of the first P-type transistor and the gate of the second N-type transistor are electrically coupled to the data input terminal, and wherein a delayed version of the clock signal is electrically coupled to the gate of the second P-type transistor, and wherein a delayed and inverted version of the clock signal is electrically coupled to the gate of the first N-type transistor.

6. The apparatus of claim 5, wherein the transistor chain is a first transistor chain, and wherein the second gated inverter circuit further comprises a second transistor chain that includes:
a third P-type transistor that is electrically coupled to the upper voltage;
a fourth P-type transistor that is electrically coupled to the third P-type transistor;
a third N-type transit that is electrically coupled to the third P-type transistor; and
a fourth N-type transistor that is electrically coupled between the third N-type transistor and the lower voltage, wherein the output of the second gated inverter is taken at the junction of the fourth P-type transistor and the third N-type transistor, and wherein the gate of the third P-type transistor and the gate of the fourth N-type transistor are electrically coupled to the output of the first transistor chain, and wherein a delayed and inverted version of the clock signal is electrically coupled to the gate of the fourth P-type transistor, and wherein a delayed version of the clock signal is electrically coupled to the gate of the third N-type transistor.

7. The apparatus of claim 6, wherein the third gated inverter circuit further comprises a third transistor chain that includes:
a fifth P-type transistor that is electrically coupled to the upper voltage;
a sixth P-type transistor that is electrically coupled to the fifth P-type transistor;
a fifth N-type transit that is electrically coupled to the fifth P-type transistor; and
a second sixth N-type transistor; wherein the first P-type transistor is electrically coupled to the upper voltage; wherein the second P-type transistor is electrically coupled to the first P-type transistor; wherein the first N-type transistor is electrically coupled to the second P-type transistor; wherein the second N-type transistor that is electrically coupled between the first fifth N-type transistor and the lower voltage; and, wherein the output of the second gated inverter is taken at the junction of the second sixth P-type transistor and the first fifth N-type transistor, wherein the gate of the fifth P-type transistor and the gate of the sixth N-type transistor are electrically coupled to the multiplexer, and wherein an inverted version of the output of the multiplexer is electrically coupled to the gate of the sixth P-type transistor and wherein the output of the multiplexer is electrically coupled to the gate of the fifth N-type transistor.

8. The apparatus of claim 7, wherein the fourth gated inverter circuit further comprises a fourth transistor chain that includes:
a seventh P-type transistor that is electrically coupled to the upper voltage;
an eighth P-type transistor that is electrically coupled to the seventh P-type transistor;
a seventh N-type transit that is electrically coupled to the second P-type transistor; and
an eighth N-type transistor that is electrically coupled between the seventh N-type transistor and the lower voltage, wherein the output of the second gated inverter is taken at the junction of the eighth P-type transistor and the seventh N-type transistor, wherein the gate of the seventh P-type transistor and the gate of the eighth N-type transistor are electrically to the output of the second gated inverter circuit, and wherein the output of the multiplexer is electrically coupled to the gate of the eighth P-type transistor, and wherein the output of the multiplexer is electrically coupled to the gate of the seventh N-type transistor.

9. An apparatus comprising:
a multiplexer; and
logic that is operable to receive an input signal and a test mode input signal and that includes a test enabled flip-flop, wherein the test enabled flip-flop includes:
a data input terminal;
a clock input terminal that is operable to receive a clock signal;
a test mode input terminal that is operable to receive the test mode input signal;
a test data input terminal;
a NOR gate that is electrically coupled to the clock terminal and the clock input terminal;
a first inverter that is electrically coupled to the NOR gate;
a first gated inverter having a first input terminal, a second input terminal, a third input terminal, a fourth input terminal, and an output terminal, wherein the first input terminal of the first gated inverter is electrically coupled to the NOR gate, and wherein second input terminal of the first gated inverter is electrically coupled to the first inverter;
a second inverter that is electrically coupled the output terminal of the first gated inverter, the third input terminal of the first gated inverter, and the fourth input terminal of the first gated inverter;
an NMOS transistor that is electrically coupled to the output terminal of the gated inverter at its drain and the first inverter at its gate;
a second gated inverter having a first input terminal, a second input terminal, a third input terminal, a fourth input terminal, and an output terminal, wherein the first input terminal of the second gated inverter is electrically coupled to the clock input terminal, and wherein the third and fourth input terminals of the second gated inverter are electrically coupled to the data input terminal; and
test mode circuitry that is electrically coupled to the test mode input terminal, the test data input terminal, the output terminal of the second gated inverter, and the source of the NMOS transistor, wherein test data is output from the test enabled flip-flop when the test mode input signal is asserted.

10. The apparatus of claim 9, wherein the test mode circuitry further comprises a third inverter coupled between the output terminal of the second gated inverter and the source of the NMOS transistor.

11. The apparatus of claim 10, wherein the third inverter further comprise a plurality of inverters coupled in series with one another.

12. The apparatus of claim 11, wherein the test mode circuitry further comprises:
a third gated inverter having a first input terminal, a second input terminal, a third input terminal, a fourth input terminal, and an output terminal, wherein the first input terminal of the third gated inverter is electrically coupled to the clock input terminal, and wherein the third and fourth input terminals of the third gated inverter are electrically coupled to the output terminal of the second gated inverter;
a fourth gated inverter having a first input terminal, a second input terminal, a third input terminal, a fourth input terminal, and an output terminal, wherein the first input terminal of the fourth gated inverter is electrically coupled to the test mode input terminal, and wherein the third and fourth input terminals of the fourth gated inverter are electrically coupled to the output terminal of the third gated inverter; and a fifth gated inverter having a first input terminal, a second input terminal, a third input terminal, a fourth input terminal, and an output terminal, wherein the first input terminal of the fifth gated inverter is electrically coupled to the test mode input terminal, and wherein the third and fourth input terminals of the fifth gated inverter are electrically coupled to the multiplexer, and wherein the output terminal of the fifth gated inverter is electrically coupled to the output terminal of the third gated inverter.

13. The apparatus of claim 11, wherein the test mode circuitry further comprises:

a first transmission gate that is electrically coupled the clock input terminal and the output terminal of the second gated inverter;

a second transmission gate that is electrically coupled to the test mode input terminal and that is coupled between the first transmission gate and the source of the NMOS transistor; and a third transmission gate that is coupled to the test mode input terminal and that is coupled between the multiplexer and the second transmission gate.

* * * * *